(12) United States Patent
Takata

(10) Patent No.: US 9,035,381 B2
(45) Date of Patent: May 19, 2015

(54) SEMICONDUCTOR DEVICE AND METHOD OF FABRICATING THE SAME

(71) Applicant: Kabushiki Kaisha Toshiba, Minato-ku, Tokyo (JP)

(72) Inventor: Osamu Takata, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/189,545

(22) Filed: Feb. 25, 2014

(65) Prior Publication Data

US 2015/0069506 A1 Mar. 12, 2015

(51) Int. Cl.
*H01L 29/78* (2006.01)
*H01L 27/092* (2006.01)
*H01L 29/66* (2006.01)
*H01L 21/8234* (2006.01)

(52) U.S. Cl.
CPC ........ *H01L 27/092* (2013.01); *H01L 29/66681* (2013.01); *H01L 29/7816* (2013.01); *H01L 21/823418* (2013.01)

(58) Field of Classification Search
CPC ............ H01L 29/7802; H01L 29/1095; H01L 29/0696; H01L 29/7835; H01L 29/0847
USPC .......... 438/230–232, 275–279; 257/339, 344, 257/391, 392, 408, 500
See application file for complete search history.

(56) References Cited

U.S. PATENT DOCUMENTS

| | | | | |
|---|---|---|---|---|
| 4,952,991 | A | * | 8/1990 | Kayama ........................ 257/335 |
| 6,255,690 | B1 | * | 7/2001 | Komori et al. ................ 257/315 |
| 7,138,689 | B2 | | 11/2006 | Inoue et al. |
| 2002/0158299 | A1 | | 10/2002 | Castro Simas et al. |

FOREIGN PATENT DOCUMENTS

| | | |
|---|---|---|
| JP | 2002-543630 A | 12/2002 |
| JP | 2004-207498 A | 7/2004 |
| JP | 2012-109425 A | 6/2012 |

* cited by examiner

*Primary Examiner* — Monica D Harrison
(74) *Attorney, Agent, or Firm* — White & Case LLP

(57) ABSTRACT

An aspect of the present embodiment, there is provided a semiconductor device includes a high-voltage element, the high-voltage element including a substrate, a first semiconductor region with a first conductive type on the substrate, an insulating isolation film on the substrate, a second semiconductor region with a second conductive type, the second semiconductor region being provided between the first semiconductor region and the insulating isolation film, a drain region with the second conductive type provided on a surface of the second semiconductor region, an impurity concentration of the drain region being higher than an impurity concentration of the second semiconductor region, a source region with the second conductive type provided on a surface of the first semiconductor, the source region being separated from the drain region, a floating drain region with the second conductive type provided on the surface of the first semiconductor region between the second semiconductor region and the source region, a first gate electrode above the first semiconductor region between the drain region and the floating drain region, a second gate electrode above the first semiconductor region between the source region and the floating drain region, a gate insulator provided between the first gate electrode and the surface of the first semiconductor region, the first gate electrode and the surface of the second semiconductor region, and the second gate electrode and the surface of the first semiconductor region, a portion of the second semiconductor region being placed under the first gate electrode through the gate insulator to be overlapped with the first gate electrode, a drain electrode on the drain region, and a source electrode on the source region.

20 Claims, 7 Drawing Sheets

US 9,035,381 B2

SEMICONDUCTOR DEVICE AND METHOD OF FABRICATING THE SAME

CROSS REFERENCE TO RELATED APPLICATION

This application is based upon and claims the benefit of priority from prior Japanese Patent Application No. 2013-188165, filed on Sep. 11, 2013, the entire contents of which are incorporated herein by reference.

FIELD

Exemplary embodiments described herein generally relate to a semiconductor device and a method of fabricating the semiconductor device.

BACKGROUND

In a Metal-Oxide-Semiconductor Field Effect Transistor (MOSFET) demanded high breakdown voltage performance, junction breakdown voltage at a drain side, for example, is set to be comparatively higher. Accordingly, an impurity concentration of a well or a substrate in the MOSFET is suppressed to be lower.

As a result, a base resistance (base potential) of a parasitic bipolar transistor is set to be higher, so that drivability of the parasitic bipolar transistor becomes easily higher. The driving of the parasitic bipolar transistor causes decrease of on-breakdown voltage.

In a device structure having both a high breakdown voltage MOSFET and a low breakdown voltage Complementary Metal-Oxide-Semiconductor (CMOS) element on a same substrate, manufacturing cost is increased when a high breakdown voltage structure specified by the high breakdown voltage MOSFET is fabricated by using another processes against prescribed processes of the low breakdown voltage CMOS.

DETAILED DESCRIPTION

Figure 1:
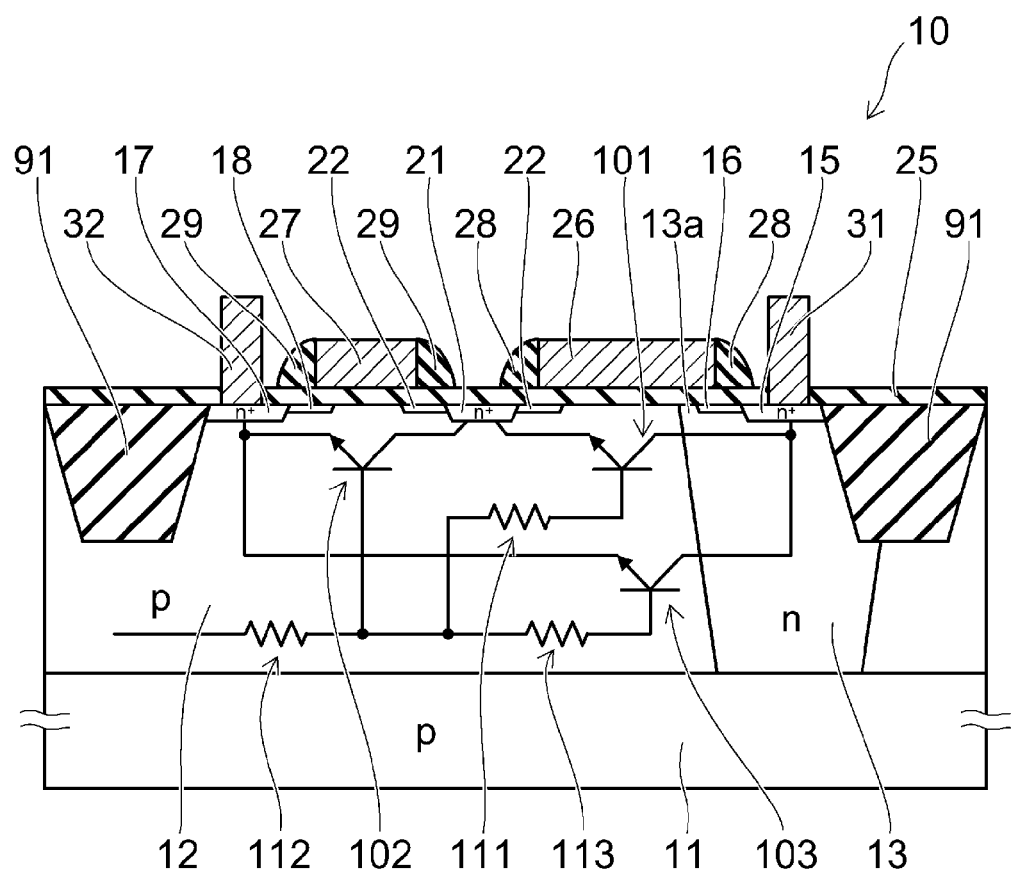
FIG. 1 is a schematic cross-sectional view showing a semiconductor device according to an embodiment.

An aspect of the present embodiment, there is provided a semiconductor device includes a high-voltage element, the high-voltage element including a substrate, a first semiconductor region with a first conductive type on the substrate, an insulating isolation film on the substrate, a second semiconductor region with a second conductive type, the second semiconductor region being provided between the first semiconductor region and the insulating isolation film, a drain region with the second conductive type provided on a surface of the second semiconductor region, an impurity concentration of the drain region being higher than an impurity concentration of the second semiconductor region, a source region with the second conductive type provided on a surface of the first semiconductor, the source region being separated from the drain region, a floating drain region with the second conductive type provided on the surface of the first semiconductor region between the second semiconductor region and the source region, a first gate electrode above the first semiconductor region between the drain region and the floating drain region, a second gate electrode above the first semiconductor region between the source region and the floating drain region, a gate insulator provided between the first gate electrode and the surface of the first semiconductor region, the first gate electrode and the surface of the second semiconductor region, and the second gate electrode and the surface of the first semiconductor region, a portion of the second semiconductor region being placed under the first gate electrode through the gate insulator to be overlapped with the first gate electrode, a drain electrode on the drain region, and a source electrode on the source region.

An aspect of another embodiment, there is provided a method of fabricating a semiconductor device, the semiconductor device including a high-voltage element, the method includes providing an insulating isolation film on a semiconductor substrate, providing a first semiconductor region with a first conductive type on the semiconductor substrate, providing a second semiconductor region with a second conductive type on the semiconductor substrate, the second semiconductor region being provided between the first semiconductor region and the insulating isolation film, providing a gate insulator on the first semiconductor region and the second semiconductor region, selectively providing both a first gate electrode and a second gate electrode being separated from the first gate electrode on the insulator, the first gate electrode being overlapped with the first semiconductor, one portion and the other portion of the second gate electrode being overlapped with the first semiconductor region and the second semiconductor region, respectively, providing a sidewall insulator on each of sidewalls of the first gate electrode and the second gate electrode, selectively introducing impurities with the second conductive type into portions of the first semiconductor region and the second semiconductor region, and a portion between the first gate electrode and the second gate electrode in the first semiconductor region to provide a source region, a drain region and a floating drain region, respectively, by ion-implanting, and providing a source electrode and a drain electrode in the first source region and the drain region, respectively.

Embodiment will be described below in detail with reference to the attached drawings mentioned above. Throughout the attached drawings, similar or same reference numerals show similar, equivalent or same components, and the description is not repeated.

In an embodiment described below, explanation is conducted as a first conductive type being a p-type and a second conductive type being an n-type, for example. However, the embodiment can be performed even when the first conductive type is the n-type and the second conductive type is the p-type.

A semiconductor device in an embodiment has a structure including both a Complementary Metal-Oxide-Semiconductor (CMOS) element and a high-voltage element, which has a higher breakdown voltage than the CMOS element, are embedded in the same substrate.

Figure 2:
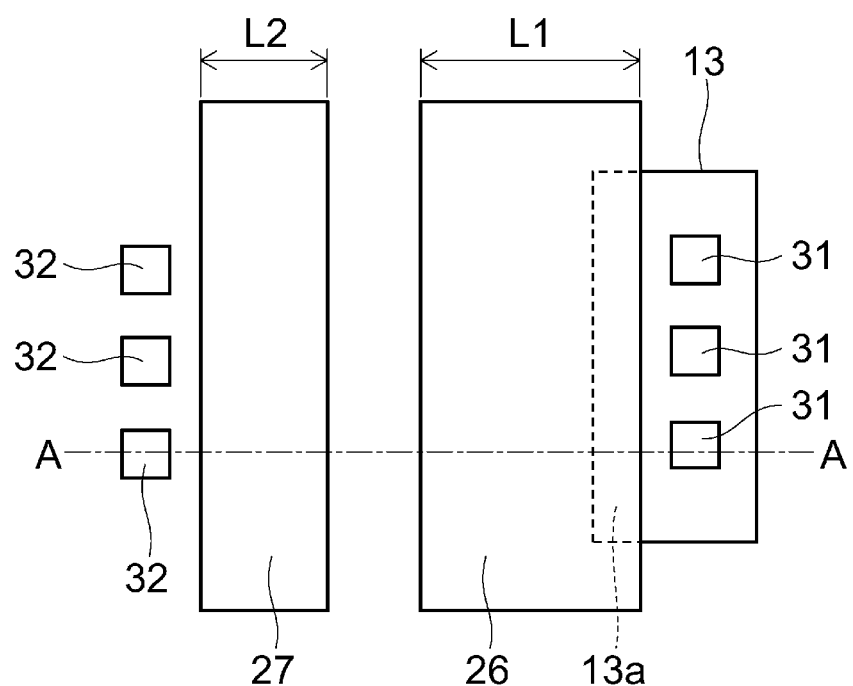
FIG. 2 is a schematic plane view showing the semiconductor device according to the embodiment.

FIG. 1 is a schematic cross-sectional view showing a semiconductor device 10 and FIG. 2 is a schematic plane view showing main components in the semiconductor device 10. FIG. 1 is corresponded to A-A cross section in FIG. 2.

The high-voltage element 10 has an n-channel type MOSFET structure, for example.

A substrate 11 is a p-type semiconductor substrate, for example, a p-type silicon substrate. A semiconductor layer (region) described below is a silicon layer (region), for example. The substrate 11 and the semiconductor layer (region) are not restricted to silicon, but may be silicon carbide or gallium nitride, for example.

A p-type well 12 as a first semiconductor region is provided on the substrate 11. An insulating isolation film 91 having a Shallow Trench Isolation (STI) structure, for example, is provided at a surface side of the p-type well 12.

The insulating isolation film 91 is composed of a silicon oxide film, for example, and is embedded in a trench formed at the surface side of the p-type well 12.

An n-type well 13 in the second semiconductor region, an n-type drain region 15, an n-type source region 17 and an n-type floating drain region 21 are provided on an element region between the insulating isolation films 91 or an element region surrounded by the insulating isolation film 91.

The n-type well 13 is provided at a surface of the p-type well 12. The n-type well 13 is adjacent to the p-type well 12 and the insulating isolation film 91. A depth of the n-type well 13 is the same as a depth of the p-type well 12. A bottom portion of the n-type well 13 reaches at the substrate 11.

The n-type well 13 is provided in a deeper portion than the insulating isolation film 91, and a portion of the n-type well 13 is contacted to a bottom portion of the insulating isolation film 91 to be overlapped with the insulating isolation film 91.

The n-type drain region 15 is provided on a surface of the n-type well 13. An n-type impurity concentration of the drain region 15 is higher than an n-type impurity concentration of the n-type well 13. One end side of the drain region 15 is contacted to the insulating isolation film 91. The depth of the drain region 15 is shallower than the depth of the insulating isolation film 91.

A low concentration drain region 16 is provided on a surface of the n-type well 13 at the other end side of the drain region 15. An n-type impurity concentration of the low concentration drain region 16 is lower than the n-type impurity concentration of the drain region 15 and higher than the n-type impurity concentration of the n-type well 13.

One end side and the other end side of the low concentration drain region 16 are contacted to the drain region 15 and a surface region 13a of the n-type well 13, respectively. A depth of the low concentration drain region 16 is shallower than the depth of the drain region.

The n-type source region 17 is provided in a region opposed to the drain region 15 in the element region between the insulating isolation films 91. The n-type source region 17 is provided on a surface of the p-type well 12 in the element region to be adjacent to the insulating isolation film 91.

A low concentration source region 18 is provided at an end portion of the drain side of the source region 17. The low concentration source region 18 is provided on a surface of the p-type well 12 to be adjacent to the source region 17. An n-type impurity concentration of the low concentration source region 18 is lower than the n-type impurity concentration of the source region 17. A depth of the low concentration source region 18 is shallower than the source region 17.

The source region 17 and the low concentration drain region 18 are provided on the surface of the p-type well 12 to be separated from the n-type well 13.

The n-type floating drain region 21 and an n-type low concentration floating drain region 22 are provided on the surface of the p-type well 12 between the low concentration drain region 16 and the low concentration source region 18.

A depth of the low concentration floating drain region 22 is shallower than the depth of the floating drain region 21. An n-type impurity concentration of the low concentration floating drain region 22 is lower than the n-type impurity concentration of the floating drain region 21.

The low concentration floating drain region 22 is adjacent to each end portion of a drain side and a source side of the floating drain region 21. The low concentration floating drain region 22 at the drain side is separated from the n-type well 13 and the low concentration drain region 16. The low concentration floating drain region 22 of the source side is separated from the low concentration source region 18.

The drain region 15, the source region 17 and the floating drain region 21 are simultaneously provided by a same ion implantation process. Accordingly, each of the drain region 15, the source region 17 and the floating drain region 21 has nearly the same n-type impurity concentration and the same depth.

The low concentration drain region 16, the low concentration source region 18 and the low concentration floating drain region 22 are simultaneously provided by a same ion implantation process. Accordingly, each of the low concentration drain region 16, the low concentration source region 18 and the low concentration floating drain region 22 have nearly the same n-type impurity concentration and the same depth.

The insulator 25 is provided on each surface of the elements previously described in the high-voltage element 10. The insulator 25 is composed of a silicon oxide film, for example.

A first gate electrode 26 and a second gate electrode 27 are provided on the insulator 25. The insulator 25 under the first gate electrode 26 and the second gate electrode 27 is act as a gate insulator.

The first gate electrode 26 is provided on the surface of the p-type well 12 through the insulator 25 (gate insulator).

The first gate electrode 26 is provided on a region between the low concentration drain region 16 and the low concentration floating drain region 22 through the insulator 25. A portion of the low concentration floating drain region 22 is placed under the first gate electrode 26 through the insulator 25 to be overlapped with the first gate electrode 26. A portion of the low concentration drain region 16 is placed under the first gate electrode 26 through the insulator 25 to be overlapped with the first gate electrode 26.

The surface region 13a of the n-type well 13 between the surface of the p-type well 12 and the low concentration drain region 16 is placed under the first gate electrode 26 through the insulator 25 to be overlapped with the first gate electrode 26.

The second gate electrode 27 is provided on the surface of the p-type well 12 through the insulator 25 (gate insulator).

The second gate electrode 27 is provided on a region between the low concentration source region 18 and the low concentration floating drain region 22 through the insulator 25. A portion of the low concentration floating drain region 22 is placed under the second gate electrode 27 through the insulator 25 to be overlapped with the second gate electrode 27. A portion of the low concentration source region 18 is place under the second gate electrode 27 through the insulator 25 to be overlapped with the second gate electrode 27.

A gate length L1 of the first gate electrode 26 is larger than a gate length L2 of the second gate electrode 27 as shown in FIG. 2. The gate length represents a channel length, namely, a length between the drain region 15 and the source region 17.

Sidewall insulators 28 are provided on both sidewalls of the first gate electrode 26 in a gate length direction. Sidewall insulators 29 are provided on both sidewalls of the second gate electrode 27 in the gate length direction.

A drain contact electrode 31 is provided on the drain region 15. The drain contact electrode 31 is connected in ohmic contact to the drain region 15. The drain contact electrode 31 is provided and electrically connected to a drain electrode layer which is a wiring layer (not shown) provided on the drain contact electrode 31.

A source contact electrode 32 is provided on the source region 17. The source contact electrode 32 is connected in ohmic contact to the source region 17. The source contact electrode 32 is provided and electrically connected to a source electrode layer which is a wiring layer (not shown) provided on the source contact electrode 32.

The first gate electrode 26 and the second gate electrode 27 are electrically connected to a same gate wiring, resulting in providing a same gate potential to the first gate electrode 26 and the second gate electrode 27.

An electrode is not connected to the floating drain region 21 which has a floating potential to be floating state.

Here, npn-type bipolar transistors 101,102,103 are parasitic in the high-voltage element 10.

In the parasitic bipolar transistor 101, the drain region 15, floating drain region 21 and the p-type well 12 acts as a collector, an emitter and a base, respectively.

In the parasitic bipolar transistor 102, each of the floating drain region 21, the source region 17 and the p-type well 12 act as a collector, an emitter and a base, respectively.

In the parasitic bipolar transistor 103, each of the drain region 15, the source region 17 and the p-type well 12 act as a collector, an emitter and a base, respectively.

The p-type impurity concentration of the p-type well 12 in the high-voltage element 10 is suppressed to be lower to increase junction breakdown voltage at the drain side. A resistance component of the p-type well 12 is represented as base resistances 111,112,113 of the parasitic bipolar transistors 101,102,103, respectively.

A higher voltage and lower voltage are relatively applied to the drain electrode (drain contact electrode) 31 and the source electrode (source contact electrode) 32, respectively. When a prescribed gate voltage is applied to both the gate electrode 26 and the second gate electrode 27, an inversion layer (first n-channel) is generated at a surface of the p-type well 12 under the first gate electrode 26 and an inversion layer (second n-channel) is generated at a surface of the p-type well 12 under the second gate electrode 27

Accordingly, electrical current is carried between the drain contact electrode 31 and the source contact electrode 32 through the drain region 15, the low concentration drain region 16, the surface region 13a of the n-type well 13, the first n-channel, the low concentration floating drain region 22 at the drain side, the floating drain region 21, the low concentration floating drain region 22 at the source side, the second n-channel, the low concentration source region 18 and the source region 17. In other words, the high-voltage element 10 is set to be on-state.

Figure 5:
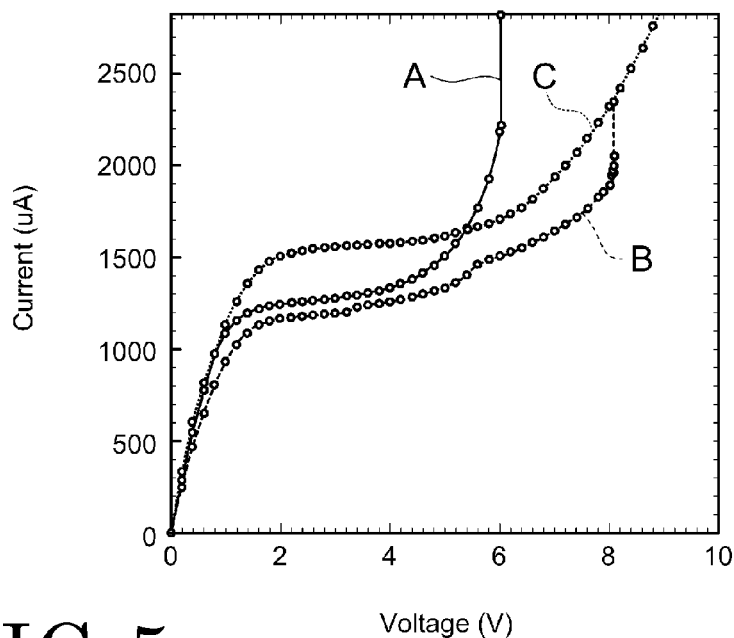
FIG. 5 is voltage-current characteristics showing the semiconductor device according to the embodiment.

FIG. 5 is a graph showing a simulation result on voltage-current characteristics of an n-channel type MOSFET to be operated at 5V. A horizontal axis and vertical axis represent a drain-source voltage (V) and a drain current (μA) flowing between the source region and the drain region, respectively.

The device simulation is performed at gate-source voltage 2V. For conducting the simulation, a resistance with 1,500Ω is contacted to a back gate terminal connected to the p-type well. In such a manner, the parasitic bipolar transistor is stably operated to emphasis a snapback phenomenon.

Further, characteristics A of a first comparative case, characteristics B of a second comparative case and characteristics C of the embodiment are simulated.

The characteristics A represent characteristics of a conventional MOSFET in which both a dual channel structure is not used and the n-type well 13 in the embodiment are not configured.

The characteristics B of the second comparative case represent characteristics of another conventional MOSFET in which the n-type well 13 is also not provided in a structure of the high voltage element 10 of the embodiment as shown in FIG. 1.

The characteristics C represent characteristics of the high-voltage element 10 of the embodiment described in FIG. 1.

In the first comparative case represented by the characteristics A, the parasitic bipolar transistor is set to be on-state by high current drivability to flow excess drain current when the drain-source voltage is set to be nearly 6V.

On the other hand, in the high-voltage element 10 of the embodiment represented by the characteristics C, the parasitic bipolar transistor is suppressed to be operated so that snapback breakdown voltage (on-breakdown voltage) is set to be over 10V, even when the drain-source voltage is set over 6V.

As described above, the base resistance with 1,500Ω is connected to the back gate terminal (p-type well 12) for conducting the simulation. Accordingly, the parasitic bipolar transistor can be stably operated in the characteristics C of the embodiment so that the drain current is continuously increased from the source-drain voltage nearly 6V. When the simulation is used in a conventional circuit, an increase of the drain current is suppressed to obtain further superior characteristics, namely, a slope of the V-I characteristics becomes smaller.

In the conventional n-channel type MOSFET structure (first comparative case), the npn-type parasitic bipolar transistor is provided with the n-type drain region, the p-type well, the n-type source region. On the other hand, the npn-type parasitic bipolar transistor of the high-voltage element 10 with a dual channel (dual gate) structure in the embodiment is divided into three npn-type parasitic bipolar transistors 101, 102, 103 as shown in FIG. 1. In such a manner, snapback breakdown voltage (on-breakdown voltage) of the high-voltage element 10 of the embodiment is improved as compared to the first comparative case as described below.

The parasitic bipolar transistor 101 has the drain region 15. The emitter of the parasitic bipolar transistor 101 is connected to a second MOSFET with the second gate electrode 27 as the emitter resistance.

As a result, increasing emitter potential of the parasitic bipolar transistor 101, in other words, increasing a voltage between the base and the emitter is suppressed so that an operation of the parasitic bipolar transistor 101 (current drivability) can be suppressed.

The collector of the parasitic bipolar transistor 102 is connected to a region, in which the drain voltage is relaxed, by a first MOSFET portion with the first gate electrode 26, and the floating drain regions 21, 22. Consequently, the operation of the parasitic bipolar transistor 102 (current drivability) can be suppressed.

When the gate length L1 of the first gate electrode 26 at the drain side is shorter, punching through may be generated. When the gate length L2 of the second gate electrode 27 is longer, the on-resistance is increased. Accordingly, the gate length L2 of the second gate electrode 27 is desired to be controlled to provide a suitable load to the parasitic bipolar transistor 101. Therefore, the gate length L1 of the first gate electrode 26 is desired to be longer than the gate length L2 of the second gate electrode 27 in consideration with a suitable balance between the breakdown voltage and the on-resistance.

The n-type well 13 is provided under the drain region 15 and the low concentration drain region 16. The n-type impurity concentration of the n-type well 13 is lower than those of the drain region 15 and the low concentration drain region 16. The n-type well 13 is provided all the p-type well 12 in the depth direction. The n-type well 13 relaxes the drain potential in the under direction. The n-type well 13 disperses current into the collector of the parasitic bipolar transistor 103. Therefore, the operation of the parasitic bipolar transistor 103 can be suppressed.

The surface region 13a of the n-type well 13 is spread not to the drain region 15 but to a channel side and the low concentration drain region 16 to be placed under the first gate electrode 26 through the insulator 25 to be overlapped with the first gate electrode 26. Accordingly, breakdown voltage at the channel side is improved. Furthermore, the n-type well 13 is overlapped with the bottom of the insulating isolation film 91 to cover the bottom of the insulating isolation film 91 at a reverse side of the channel side. In such a manner, a junction breakdown voltage at the drain side can be improved up to 10V.

As shown FIG. 5, the n-type well 13 is not provided in the second comparative case represented by the characteristics B. As shown in the characteristics B of FIG. 5, the snapback phenomenon (on-breakdown voltage) is improved as compared to the first comparative case (characteristics A), however, the junction breakdown voltage at the drain side is lowered as compared to the embodiment to be occurred breakdown at nearly 8V.

The n-type well 13 is provided under the drain region 15 and the low concentration drain region 16 according to the embodiment. The n-type impurity concentration of the n-type well 13 is lower than those of the drain region 15 and the low concentration drain region 16. Consequently, breakdown voltage at the drain side can be improved by the n-type well 13.

The low concentration drain region 16 is provided between the surface region 13a of the n-type well 13 adjacent to the channel under the first gate electrode 26 and the drain region 15 according to the embodiment. The n-type impurity concentration of the low concentration drain region 16 is higher than that of the n-type well 13 and is lower than that of the drain region 15.

Such the low concentration drain region 16 can improve breakdown voltage and decrease on-resistance as compared to a case without the low concentration drain region 16, in other words, all the surface region between the drain region 15 and the channel being the n-type well 13.

As described above, high-voltage element 10 according to the embodiment can improve both on-breakdown voltage and static breakdown voltage.

The high-voltage element 10 and a CMOS element having a CMOS structure and a lower breakdown voltage than the high-voltage element 10 are embedded on a same substrate in the semiconductor device according to the embodiment.

Figure 3:
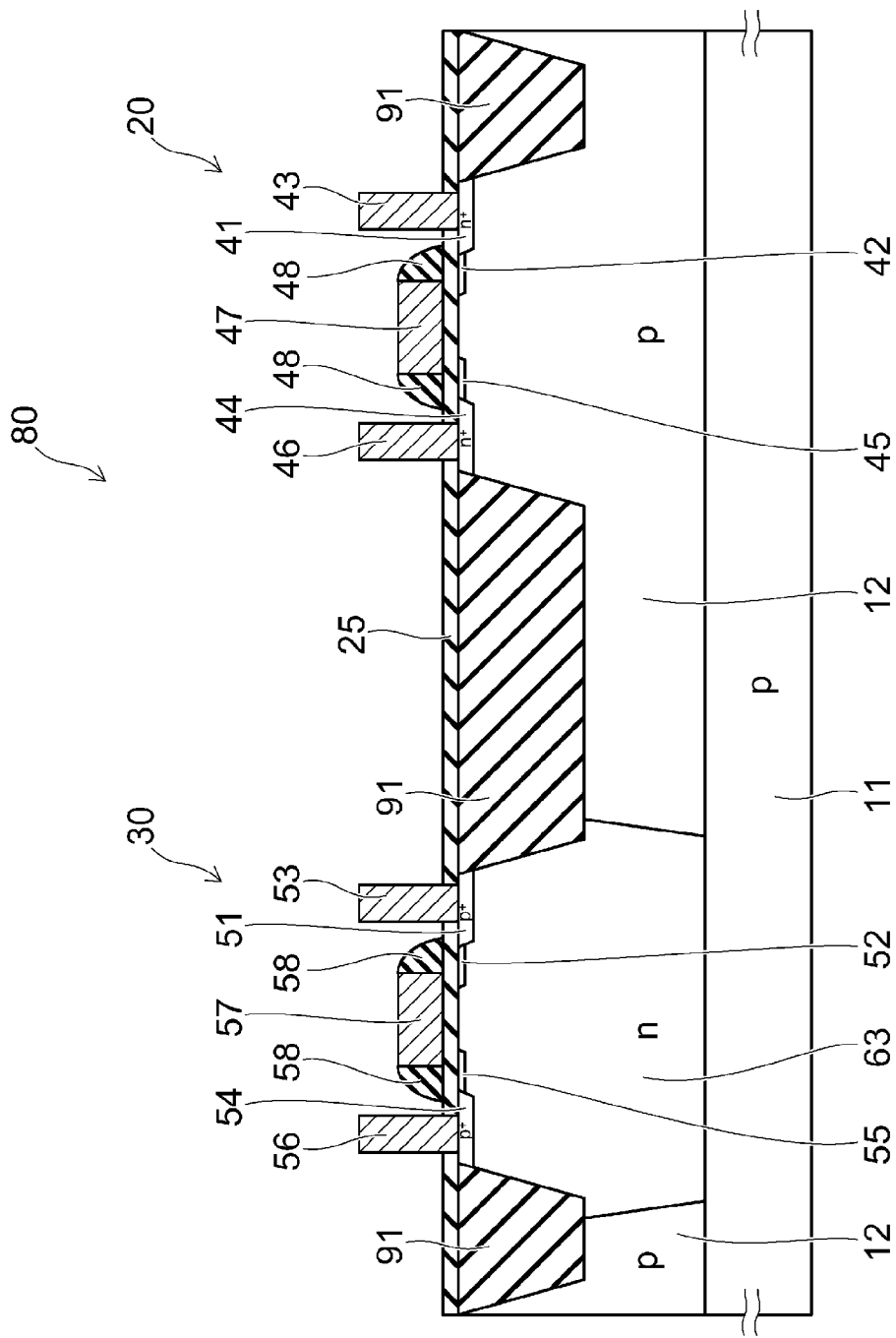
FIG. 3 is a schematic cross-sectional view showing the semiconductor device according to the embodiment.

FIG. 3 is a schematic cross-sectional view showing a CMOS element 80.

The CMOS element 80 has an n-channel type MOSFET (n-ch MOS 20, hereinafter) and a p-channel type MOSFET (p-ch MOS 20, hereinafter).

First, the n-ch MOS 20 is described.

The n-ch MOS 20 includes the p-type well 12 as the p-type semiconductor region on the substrate 11. The insulating isolation film 91 is provided at the surface side of the p-type well 12.

An n-type drain region 41, an n-type source region 44, an n-type low concentration drain region 42 and an n-type low concentration source region 45 are provided in an element region between the insulating isolation films 91 or in an element region surrounded by the insulating isolation film 91.

The drain region 41 and the source region 44 provided on a surface of the p-type well 12 to be separated each other. The low concentration drain region 42 and the low concentration source region 45 are provided on a surface of the p-type well in a region between the drain region 41 and the source region 44.

One end portion of the drain region 41 is contacted to the insulating isolation film 91. The other end portion at the source side 44 of the drain region 41 is contacted to the low concentration drain region 42.

A depth of the low concentration drain region 42 is shallower than that of the drain region 41. An n-type impurity concentration of the low concentration drain region 42 is lower than that of the drain region 41.

One end portion of the source region 44 is contacted to the insulating isolation film 91. The other end portion at the drain region 41 side of the source region 44 is contacted to the low concentration source region 45.

A depth of the low concentration source region 45 is shallower than a depth of the source region 44. An n-type impurity concentration of the low concentration source region 45 is lower than that of the source region 44.

The surface region of the p-type well 12 is provided between the low concentration drain region 42 and the low concentration source region 45.

The insulator 25 is provided on surfaces of the elements described above in the n-ch MOS 20. A gate electrode 47 is provided on the insulator 25. The insulator 25 under the gate electrode 47 acts as a gate insulator of the n-ch MOS 20.

The gate electrode 47 is provided above a region between the low concentration drain region 42 and the low concentration source region 45 through the insulator (gate insulator) 25. The gate electrode 47 is provided a surface of the p-type well between the low concentration source region 45 and the low concentration drain region through the insulator 25. A portion of the low concentration source region 45 is placed under the gate electrode 47 through the insulator 25 to be overlapped with the gate electrode 47. A portion of the low concentration source region 45 is placed under the gate electrode 47 through the insulator 25 to be overlapped with the gate electrode 47.

Sidewall insulators 48 are provided on both sidewalls of the gate electrode 47 in a gate length direction.

A drain contact electrode 43 is provided on the drain region 41. The drain contact electrode 43 is connected in ohmic contact to the drain region 41. The drain contact electrode 43 is electrically connected a drain electrode layer, which is a wiring layer (not shown) and is provided on the drain contact electrode 43.

A source contact electrode 46 is provided on the source region 44. The source contact electrode 46 is connected in ohmic contact to the source region 44. The source contact electrode 46 is electrically connected a drain electrode layer, which is a wiring layer (not shown) and is provided on the source contact electrode 46.

The gate electrode 47 is connected to the gate wiring (not shown).

Next, the p-ch MOS 30 has also the same structure as the n-ch MOS 20 to be a p-ch MOSFET. A reverse conductive type to the n-ch MOS 20 is utilized in the p-ch MOS 30.

The p-ch MOS 30 includes an n-type well 63 provided by implanting n-type impurity ions into the p-type well 12 on the substrate 12. Furthermore, The p-ch MOS 30 includes the insulating isolation film 91, a p-type drain region 51, a p-type source region 54, a p-type low concentration drain region 52, a p-type low concentration source region 55, a gate insulator 25, a gate electrode 57, the sidewall insulators 58, a drain electrode 53 and a source electrode 56. As the p-ch MOS 30 has the same constitution with the n-ch MOS 20 under the condition in reversely changing the conductive impurity type to the n-ch MOS 20. Therefore, the explanation is omitted.

The high-voltage element 10 is simultaneously provided with the CMOS element 80 by using the same processing steps of the CMOS element 80.

The insulating isolation film 91 having a Shallow Trench Isolation (STI) structure at a surface side of a substrate 11.

The p-type well 12 is provided on the substrate 11. The p-type well 12 is provided in an entire surface of the substrate 11 including a region of the high-voltage element 10 and a region of the CMOS element 80.

By ion implantation using a mask (not shown), n-type impurities are selectively implanted into the p-type well 12. The n-type impurities are diffused into the substrate 11 by heat treatment.

In such a manner, the n-type well 13 is provided in the region of the high-voltage element 10 as shown in FIG. 1 and an n-type well 63 is provided in a region of a p-ch MOS 30 as shown in FIG. 3.

Namely, the n-type well 13 and the n-type well 63 are simultaneously provided by using the same processing steps. The n-type well 13 and the n-type well 63 are substantially the same depth and the same n-type impurity concentration.

An insulator 25 is provided on a surface of the semiconductor region including the p-type well 12, the n-type well 13 and the n-type well 63.

Next, a gate electrode material layer is provided on the insulator 25. The gate electrode material layer is entirely provided on the insulator 25. The gate electrode material layer is patterned by lithography and etching.

In such a manner, the first gate electrode 26 and the second gate electrode 27 are provided in the region of the high-voltage element 10 as shown in FIG. 1. The gate electrode 47 is provided in a region of an n-ch MOS 20 and the gate electrode 57 is provided in a region of a p-ch MOS 30 as shown in FIG. 3.

By ion implantation, impurities are implanted into a surface of the semiconductor region including the p-type well 12, the n-type well 13 and the n-type well 63 by ion implantation.

Using the first gate electrode 26, the second gate electrode 27 and the insulating isolation film 91 as a mask, n-type impurities are implanted into a surface of the n-type well 13 and a surface of the p-type well 12 in the high-voltage element 10.

In the surface of the p-type well 12 in the n-ch MOS 20, n-type impurities are implanted by using the gate electrode 47 and the insulating isolation film 91 as a mask.

In the surface of the n-type well 63 in the p-ch MOS 30, p-type impurities are implanted by using the gate electrode 57 and the insulating isolation film 91 as a mask.

The implanted impurities are diffused by thermal diffusion. In such a manner, the low concentration drain region 16 is provided on the surface of the n-type well 13 in the high-voltage element 10 in self-aligning with the first gate electrode 26 and the insulating isolation film 91.

The low concentration source region 18 and the low concentration floating drain region 22 is provided on the surface of the p-type well 12 in the high-voltage element 10 in self-aligning with the first gate electrode 26, second gate electrode 27 and the insulating isolation film 91.

The low concentration drain region 42 and the low concentration source region 45 is provided on the surface of the p-type well 12 in the n-ch MOS 20 in self-aligning with the gate electrode 47 and the insulating isolation film 91.

The low concentration drain region 52 and the low concentration source region 55 is provided on a surface of the n-type well 63 in the p-ch MOS 30 in self-aligning with the gate electrode 57 and the insulating isolation film 91.

Namely, the low concentration drain region 16, the low concentration floating drain region 22, the low concentration source region 18, the low concentration drain region 42 and the low concentration source region 45 are simultaneously provided by the same processing steps. The low concentration drain region 52 and the low concentration source region 55 are simultaneously provided by the same processing steps.

The low concentration drain region 16, the low concentration floating drain region 22, the low concentration source region 18, the low concentration drain region 42 and the low concentration source region 45 have substantially the same depth. The low concentration drain region 52 and the low concentration source region 55 have substantially the same depth.

The low concentration drain region 16, the low concentration floating drain region 22, the low concentration source region 18, the low concentration drain region 42 and the low concentration source region 45 have substantially the same n-type impurity concentration.

The low concentration drain region 52 and the low concentration source region 55 have substantially the same p-type impurity concentration.

Sidewall insulators 28, 29, 48, 58 are provided on sidewalls of the first gate electrode 26, the second gate electrode 27, the gate electrode 47 and the gate electrode 57.

Next, impurities are implanted into the surface of the semiconductor region including the p-type well 12, the n-type well 13 and the n-type well 63 by ion implantation.

In the high-voltage element 10, n-type impurities are implanted into the surface of the n-type well 13 and the surface of the p-type well 12 using the first gate electrode 26, the second gate electrode 27, the sidewall insulators 28, 29 and the insulating isolation film 91 as a mask.

In the n-ch MOS 20, n-type impurities are implanted into the surface of the p-type well 12 using the gate electrode 47, the sidewall insulator 48 and the insulating isolation film 91 as a mask.

In the p-ch MOS 30, p-type impurities are implanted into the surface of the n-type well 63 using the gate electrode 57, the sidewall insulator 58 and the insulating isolation film 91 as a mask.

Implanted impurities are diffused by thermal diffusion. In such a manner, the drain region 15 is provided on the surface of the n-type well 13 in the high-voltage element 10 in self-aligning with the first gate electrode 26, the sidewall insulators 28 and the insulating isolation film 91.

The source region 17 and the floating drain region 21 is provided in the surface of the p-type well 12 in the high-voltage element 10 in self-aligning with the first gate electrode 26, the second gate electrode 27, the sidewall insulator 28, the sidewall insulator 29 and the insulating isolation film 91.

The drain region 41 and the source region 44 are provided in the surface of the p-type well 12 in the n-ch MOS 20 in self-aligning with the gate electrode 47, sidewall insulators 28 and the insulating isolation film 91.

The drain region 51 and the source region 54 are provided in the surface of the n-type well 63 in the p-ch MOS 30 in self-aligning with the gate electrode 57, sidewall insulators 58 and the insulating isolation film 91.

Namely, the drain region 15, the floating drain region 21, the source region 17, the drain region 41 and the source region 44 are simultaneously provided in the same processing steps. The drain region 51 and the source region 54 are simultaneously provided in the same processing steps.

The drain region 15, the floating drain region 21, the source region 17, the drain region 41 and the source region 44 have substantially the same depth. The drain region 51 and the source region 54 have substantially the same depth.

The drain region 15, the floating drain region 21, the source region 17, the drain region 41 and the source region 44 have substantially the same n-type impurity concentration.

The drain region 51 and the source region 54 have substantially the same p-type impurity concentration.

After that, the drain contact electrodes 31, 43, 53 and the source contact electrodes 32, 46, 56 are simultaneously provided in the same processing steps.

As described above, the high-voltage element 10 can be provided by conventional CMOS processing steps according to the embodiment. Other specific processing steps to be added for the high-voltage element 10 are not necessary. The high-voltage element 10 and the CMOS element 80 can be simultaneously provided on the same substrate in lower cost.

In the high-voltage element 10, a distance between the first electrode 26 and the second gate electrode 27 may become narrower. In the above case, a space between the sidewall insulator 28 of the first gate electrode 26 and the sidewall insulator 29 of the second gate electrode 27 may be not provided or the space is extremely narrower so that the floating drain region 21 may be not provided.

In the above case, the floating drain region is provided by the low concentration floating drain region 22. In such the case, the low concentration floating drain region 22 is not connected to the source electrode to be the floating state, so that increase of the base-emitter voltage of the parasitic bipolar transistor 101 is suppressed to prevent driving of the parasitic bipolar transistor.

Figure 4:
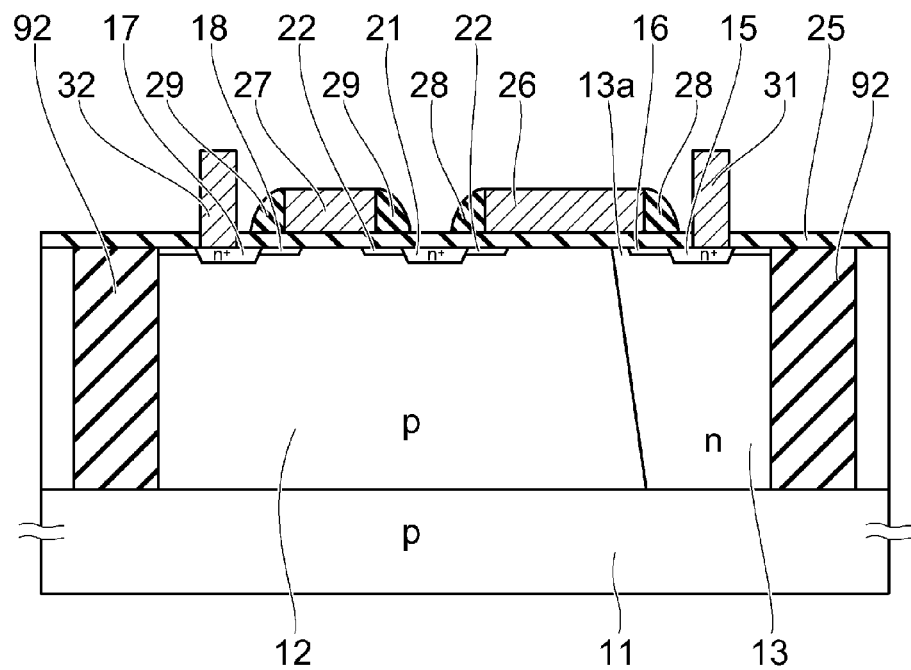
FIG. 4 is a schematic cross-sectional view showing the semiconductor device according to the embodiment.

It is not restricted to the STI structure as the insulating isolation film. As shown in FIG. 4, an insulating isolation film 92 having deep trench isolation (DTI) structure can be utilized.

The insulating isolation film 92 reaches the substrate 11. The n-type well 13 is adjacent to the insulating isolation film 92 all over in the depth direction. In such the case, the depth of the n-type well 13 has nearly the same depth of the DTI structure 92. The n-type well 13 is not contacted to the DTI structure 92.

In the embodiment described above, the high-voltage element 10 with the n-channel type is explained, however, the high-voltage element with the p-channel type can be used.

Figure 6:
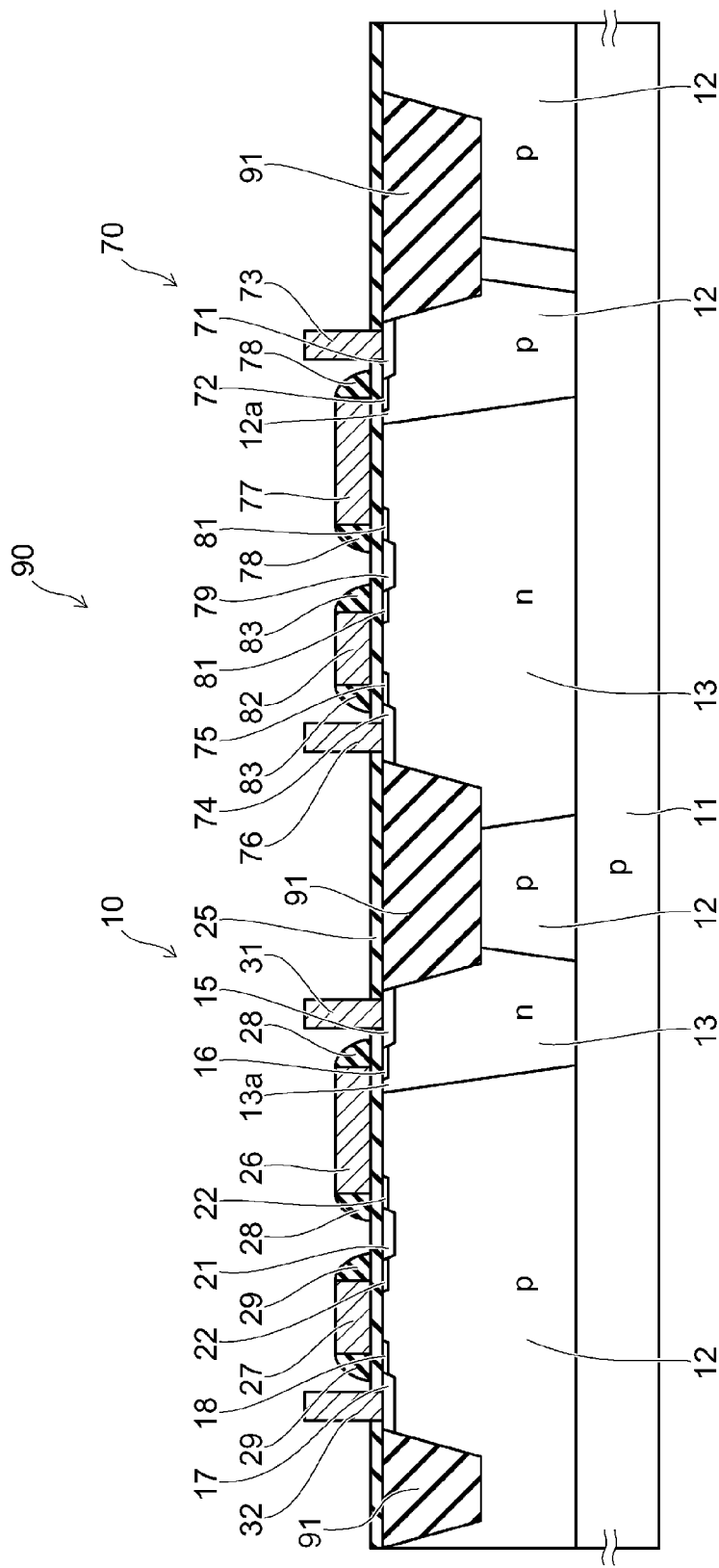
FIG. 6 is a schematic cross-sectional view showing the semiconductor device according to the embodiment.

As shown in FIG. 6, a high-voltage element 10 with the n-channel type and a high-voltage element 70 with the p-channel type are provided on the same substrate 11. The high-voltage CMOS element 90 is constituted with the high-voltage element 10 with the n-channel type and a high-voltage element 70.

The conventional CMOS element 80 as shown in FIG. 3 and a high-voltage CMOS element 90 with a higher breakdown voltage than the conventional CMOS element 80 as shown in FIG. 6 are provided on the same substrate 11.

The high-voltage element 70 has the p-channel type in reverse to the n-channel type of the high-voltage element 10.

The n-type well 13 is provided in the region in which the high-voltage element 70 with the p-channel type is provided. The n-type well 13 is simultaneously provided by the same processing steps with the n-type well 13 of the high-voltage element 10 with the n-channel type and the n-type well 13 of the CMOS element 80.

The p-type well 12 is provided to be adjacent to the n-type well 13 and the insulating isolation film 91. The p-type well 12 of the CMOS element 90 and the p-type well 12 of the CMOS element 80 are simultaneously provided in the same processing steps.

The p-type well 12 of the p-channel type high-voltage element 70 is provided deeper than the insulating isolation film 91. A portion of the p-type well 12 is contacted to a bottom portion of the insulating isolation film 91.

The p-type drain region 71 provided on the surface of the p-type well 12 of the p-channel type high-voltage element 70. The p-type impurity concentration of the drain region 71 is higher than the p-type impurity concentration of the p-type well 12. One end side of the drain region 71 is connected to the insulating isolation film 91. The depth of the drain region 71 is shallower than the depth of the insulating isolation film 91.

The low concentration drain region 72 is provided on the surface of the p-type well 12 at the other end side of the drain region 71. The p-type impurity concentration of the low concentration drain region 72 is lower than that of the drain region 71 and is higher than the p-type impurity concentration of the p-type well 12.

One end side of the low concentration drain region 72 is contacted to the drain region 71, and the other end side of the low concentration drain region 72 is contacted to the surface region 12a of the p-type well 12. The depth of the low concentration drain region 72 is shallower than the depth of the drain region 71.

The p-type source region 74 is provided on a region opposed to the region in which the drain region 71 is provided in the element region between the insulating isolation films 91. The p-type source region 74 is provided on the surface of the n-type 13 in the element region and adjacent to the insulating isolation film 91.

The low concentration source region 75 is provided on the end portion at the drain side of the source region 74. The low concentration source region 75 is provided on the surface of the n-type well 13 to be adjacent to the source region 74. The p-type impurity concentration of the low concentration source region 75 is lower than that of the source region 74 and the depth of the low concentration source region 75 is shallower than that of the source region 74.

The source region 74 and the low concentration source region 75 are provided on the surface of the n-type well 13 to be separated to the p-type well 12.

The p-type floating drain region 79 and the p-type low concentration floating drain region 81 are provided on the surface of the n-type well 13 between the low concentration drain region 72 and the low concentration source region 75.

The depth of the low concentration floating drain region 81 is shallower than that of the floating drain region 79. The p-type impurity concentration of the low concentration floating drain region 81 is lower than that of the floating drain region 79.

The low concentration floating drain region 81 is adjacent to each of end portions at a drain side and a source side of the floating drain region 79. The low concentration floating drain region 81 at the drain side is separated to the p-type well 12 and the low concentration drain region 72. The low concentration floating drain region 81 at the source side is separated to the low concentration source region 75.

The drain region, the source region and the floating drain region of the p-channel type high-voltage element 70 and the p-ch MOS 30 are simultaneously provided in the same processing steps.

The low concentration drain region, the low concentration source region and the low concentration floating drain region in the p-channel type high-voltage element 70 and the p-ch MOS 30 are simultaneously provided in the same processing steps. The first gate electrode 77 and the second gate electrode 82 are provided on the insulator in the region provided the p-channel type high-voltage element 70. The insulator 25 under the first gate electrode 77 and the second gate electrode 82 is act as the gate insulator.

The first gate electrode 77 is provided on the surface of the n-type well 13 through the insulator (gate insulator) 25.

The first gate electrode 77 is provided on a region between the low concentration drain region 72 and the low concentration floating drain region 81 through the insulator 25. A portion of the low concentration floating drain region 81 is placed under the first gate electrode 77 through the insulator 25 to be overlapped with the first gate electrode 77. A portion of the low concentration drain region 72 is placed under the first gate electrode 72 through the insulator 25 to be overlapped with the first gate electrode 72.

The surface region 12a of the p-type well 12 between the surface of the n-type well 13 and the low concentration drain region 72 is also placed under the first gate electrode 77 through the insulator 25 to be overlapped with the first gate electrode 77.

The second gate electrode 82 is provided on the surface of the n-type well 13 through the insulator (gate insulator) 25.

The second gate electrode 82 is provided on the region between the low concentration source region 75 and the low concentration floating drain region 81 through the insulator 25. A portion of the low concentration floating drain region 81 is placed under the second gate electrode 82 through the insulator 25 to be overlapped with the second gate electrode 82. A portion of the low concentration source region 75 is placed under the second gate electrode 82 through the insulator 25 to be overlapped with the second gate electrode 82.

A gate length of the first gate electrode 77 is longer than that of the second gate electrode 82. Sidewall insulators 78 are provided on both sidewalls of the first gate electrode 77 in a gate length direction. Sidewall insulators 83 are provided on both sidewalls of the second gate electrode 82 in a gate length direction.

The drain contact electrode 73 is provided on the drain region 71. The drain contact electrode 73 is contacted in ohmic contact to the drain region 71. The drain contact electrode 73 is electrically connected to the drain electrode layer which is a wiring layer (not shown) provided on the drain contact electrode 73.

The source contact electrode 76 is provided on the source region 74. The source contact electrode 76 is contacted in ohmic contact to the source region 74. The source contact electrode is electrically connected to the source electrode layer which is a wiring layer (not shown) provided on the drain contact electrode 76.

The first gate electrode 77 and the second gate electrode 82 are electrically connected to the same gate wiring (not shown), and the first gate electrode 77 and the second gate electrode 82 are applied to the same gate potential.

An electrode is not connected to the floating drain region 79 so that potential of the floating drain region 79 is in a floating state.

When a prescribed gate voltage is applied to both the first gate electrode 77 and the second gate electrode 82, an inversion layer (first p-channel) is generated in a surface of the n-type well 13 under the first gate electrode 77 and an inversion layer (second p-channel) is generated in a surface of the n-type well 13 under the second gate electrode 82.

Accordingly, current flows between the drain contact electrode 73 and the source contact electrode 76 between the drain region 71, the low concentration drain region 72, the surface region 12a of the p-type well 12, the first p-channel, the low concentration floating drain region 81 at the drain side, the floating drain region 79, the low concentration floating drain region 81 at the source side, the second p-channel, the low concentration source region 75 and the source region 74. Namely, high-voltage element 70 is set to be on-state.

The high-voltage element 70 with p-channel type provides the same effects of the high-voltage element 70 with n-channel type.

In the dual channel (dual gate) structure of the high-voltage element 70, the parasitic bipolar transistor is divided into three pnp-type parasitic bipolar transistors to improve snapback breakdown voltage (on-breakdown voltage).

Furthermore, breakdown voltage at the drain side can be improved by the p-type well 12. The p-type well 12 is provided under the drain region 71. The p-type impurity concentration of the p-type well 12 is lower than the drain region 71 and the low concentration drain region 72.

Figure 7:
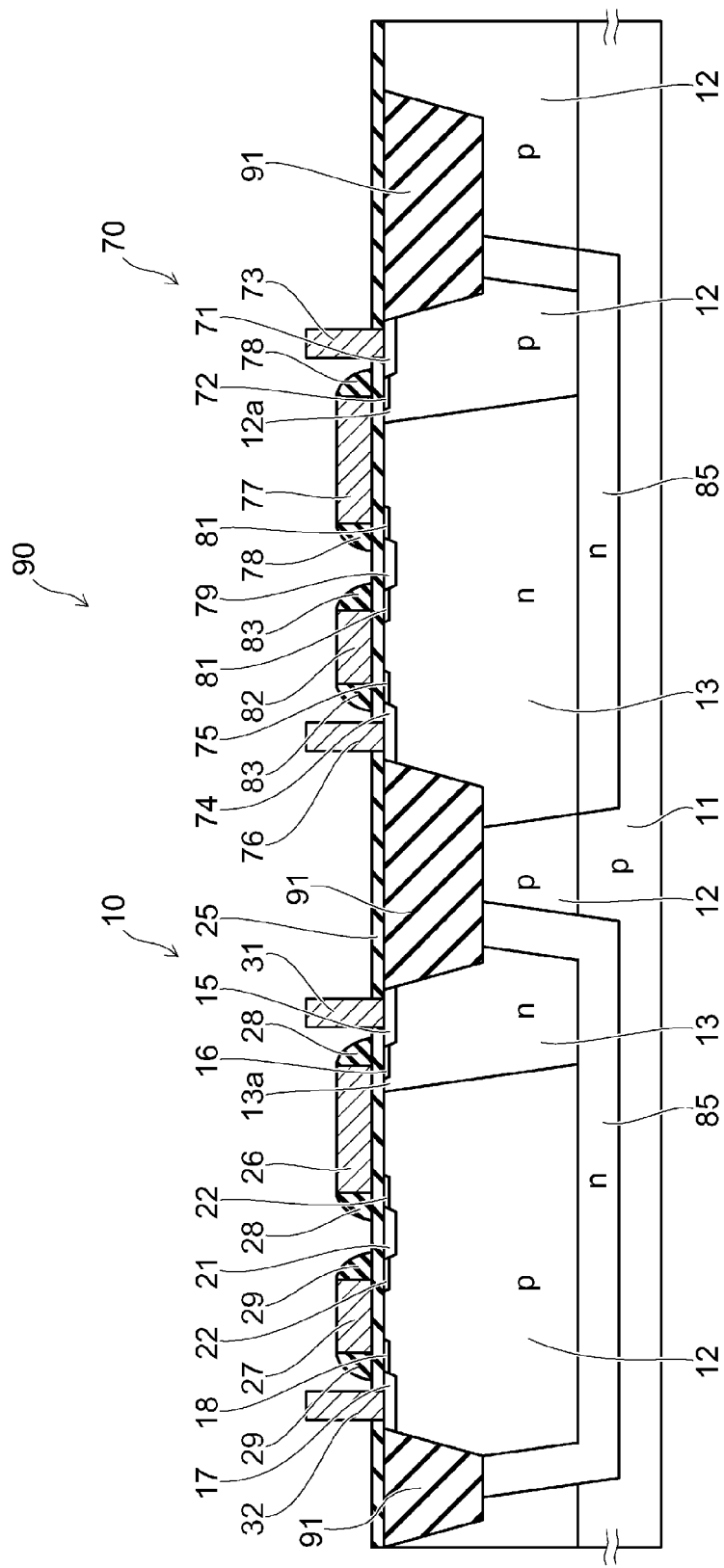
FIG. 7 is a schematic plane view showing the semiconductor device according to the embodiment.
Figure 8:
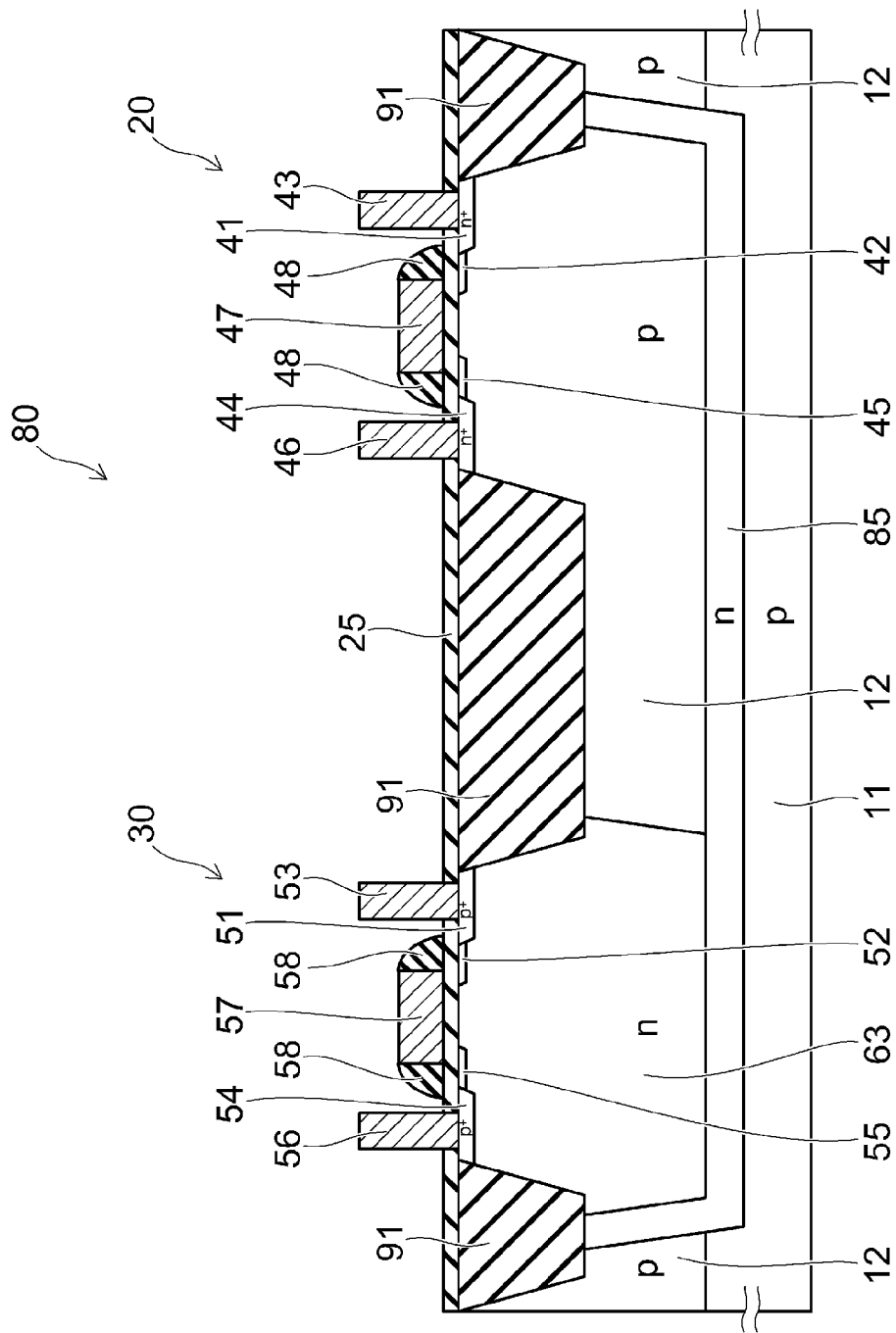
FIG. 8 is a schematic cross-sectional view showing the semiconductor device according to the embodiment.

As shown in FIGS. 7, 8, an n-type deep well 85 can be provided between the p-type well 12 and the substrate 11, and between the n-type well 13 and the substrate 11 in the CMOS element 90 and the CMOS element 80, respectively.

An n-type impurity concentration of the deep well 85 is higher than that of the n-type well 13 and the p-type impurity concentrations of both the p-type well 12 and the p-type substrate 11. The deep well 85 surely separated the CMOS element 90 and the CMOS element 80.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising a high-voltage element,
the high-voltage element comprising:
a substrate;
a first semiconductor region with a first conductive type on the substrate;
an insulating isolation film on the substrate;
a second semiconductor region with a second conductive type, the second semiconductor region being provided between the first semiconductor region and the insulating isolation film;
a drain region with the second conductive type provided on a surface of the second semiconductor region, an impurity concentration of the drain region being higher than an impurity concentration of the second semiconductor region;

a source region with the second conductive type provided on a surface of the first semiconductor, the source region being separated from the drain region;

a floating drain region with the second conductive type provided on the surface of the first semiconductor region between the second semiconductor region and the source region;

a first gate electrode above the first semiconductor region between the drain region and the floating drain region;

a second gate electrode above the first semiconductor region between the source region and the floating drain region;

a gate insulator provided between the first gate electrode and the surface of the first semiconductor region, the first gate electrode and the surface of the second semiconductor region, and the second gate electrode and the surface of the first semiconductor region, a portion of the second semiconductor region being placed under the first gate electrode through the gate insulator to be overlapped with the first gate electrode;

a drain electrode on the drain region; and a source electrode on the source region.

2. The semiconductor device of claim 1, wherein
A gate length of the first gate electrode is longer than a gate length of the second gate electrode.

3. The semiconductor device of claim 1, wherein
the insulating isolation film includes a structure in which a depth of the insulating isolation film is shallower than a depth of the second semiconductor region and a portion of the second semiconductor region is contacted to be overlapped with a bottom of the insulating isolation film.

4. The semiconductor device of claim 1, wherein
a depth of the bottom of the insulating isolation film has nearly a same depth of a bottom of the second semiconductor region.

5. The semiconductor device of claim 1, further comprising:
a low concentration drain region with the second conductive type being adjacent to the drain region on the surface of the second semiconductor region, an impurity concentration of the low concentration drain region being lower than the impurity concentration of the drain region and higher than the impurity concentration of the second semiconductor region.

6. The semiconductor device of claim 1, further comprising:
a low concentration source region with the second conductive type being adjacent to the source region on the surface of the first semiconductor region, an impurity concentration of the low concentration source region being lower than the impurity concentration of the source region.

7. The semiconductor device of claim 1, further comprising:
low concentration floating drain regions with the second conductive type being adjacent to both a source region side and a drain region side of the floating drain region, an impurity concentration of the low concentration floating drain region is lower than the impurity concentration of the floating drain region.

8. The semiconductor device of claim 1, wherein
each of the drain region, the source region and the floating drain region has nearly a same impurity concentration and a same impurity depth.

9. The semiconductor device of claim 1, wherein
the first conductive type is one of a p-type and an n-type, and the second conductive type is the other of the p-type and the n-type.

10. The semiconductor device of claim 1, wherein
the substrate has one of the first conductive type and the second conductive type.

11. The semiconductor device of claim 1, further comprising:
a pair of a first element and a second element being included in a CMOS structure, the first element and the second element being provided in a third semiconductor region with the first conductive type and a fourth semiconductor region with the second conductive type, respectively, on the semiconductor substrate.

12. The semiconductor device of claim 1, further comprising:
a third semiconductor region with a reverse conductive type to the conductive type of the substrate between both the first semiconductor region and the second semiconductor region and the substrate.

13. The semiconductor device of claim 12, wherein
an impurity concentration of the third semiconductor region is higher than the impurity concentrations of the first semiconductor region, the second semiconductor region and the substrate.

14. The semiconductor device of claim 1, wherein
the first gate electrode and the second gate electrode are electrically connected.

15. The semiconductor device of claim 1, wherein
The floating drain region has a floating potential to be floating state.

16. A semiconductor device, comprising a high-voltage element,
the high-voltage element having a pair of a first element and a second element, the pair being configured as a CMOS structure, each of the first element and the second element comprising:
a substrate;
a first semiconductor region with a first conductive type on the substrate;
an insulating isolation film on the substrate;
a second semiconductor region with a second conductive type, the second semiconductor region being provided between the first semiconductor region and the insulating isolation film;
a drain region with the second conductive type provided on a surface of the second semiconductor region, an impurity concentration of the drain region being higher than an impurity concentration of the second semiconductor region;
a source region with the second conductive type provided on a surface of the first semiconductor, the source region being separated from the drain region;
a floating drain region with the second conductive type provided on the surface of the first semiconductor region between the second semiconductor region and the source region;
a first gate electrode above the first semiconductor region between the drain region and the floating drain region;
a second gate electrode above the first semiconductor region between the source region and the floating drain region;
a gate insulator provided between the first gate electrode and the surface of the first semiconductor region, the first gate electrode and the surface of the second semiconductor region, and the second gate electrode and the surface of the first semiconductor region, a portion of the second semiconductor region being placed under the first gate electrode through the gate insulator to be overlapped with the first gate electrode;

a drain electrode on the drain region; and a source electrode on the source region, wherein the first conductive type is a p-type and the second type is an n-type in the first element, and the first conductive type is the n-type and the second type is the p-type in the second element;

the other of the p-type and the n-type in the second element, and the second conductive type is the other of the p-type and the n-type in the first element and the one of the p-type and the n-type in the second element.

17. The semiconductor device of claim 16, wherein
the substrate has one of the first conductive type and the second conductive type.

18. The semiconductor device of claim 16, further comprising:
a pair of a third element and a fourth element being included in a CMOS structure, the third element and the fourth element being provided in a third semiconductor region with the first conductive type and a fourth semiconductor region with the second conductive type, respectively, on the semiconductor substrate.

19. A method of fabricating a semiconductor device comprising a high-voltage element,
the method comprising:
providing an insulating isolation film on a semiconductor substrate;
providing a first semiconductor region with a first conductive type on the semiconductor substrate;
providing a second semiconductor region with a second conductive type on the semiconductor substrate, the second semiconductor region being provided between the first semiconductor region and the insulating isolation film;
providing an insulator on the first semiconductor region and the second semiconductor region;
selectively providing both a first gate electrode and a second gate electrode being separated from the first gate electrode on the insulator, the first gate electrode being overlapped with the first semiconductor, one portion and the other portion of the second gate electrode being overlapped with the first semiconductor region and the second semiconductor region, respectively;
providing a sidewall insulator on each of sidewalls of the first gate electrode and the second gate electrode;
selectively introducing impurities with the second conductive type into portions of the first semiconductor region and the second semiconductor region, and a portion between the first gate electrode and the second gate electrode in the first semiconductor region to provide a source region, a drain region and a floating drain region, respectively.

20. The method of claim 19, further comprising:
selectively introducing impurities with the second conductive type into regions adjacent to the source region, the drain region and the floating drain region to provide a low concentration source region, a low concentration drain region and a low concentration floating drain region, respectively, after providing both the first gate electrode and the second gate electrode and before providing the side wall insulator.

* * * * *